(12) United States Patent
Prabhu

(10) Patent No.: US 7,067,354 B2
(45) Date of Patent: Jun. 27, 2006

(54) ELECTRICAL DIE CONTACT STRUCTURE AND FABRICATION METHOD

(75) Inventor: Ashok Prabhu, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 179 days.

(21) Appl. No.: 10/871,337

(22) Filed: Jun. 18, 2004

(65) Prior Publication Data

US 2004/0229405 A1 Nov. 18, 2004

Related U.S. Application Data

(60) Continuation-in-part of application No. 10/145,295, filed on May 13, 2002, and a division of application No. 10/310,724, filed on Dec. 4, 2002, now Pat. No. 6,781,244.

(51) Int. Cl.
  *H01L 21/44* (2006.01)
(52) U.S. Cl. ........................ 438/113; 438/460; 438/462
(58) Field of Classification Search ................ 438/113, 438/114, 460, 462, 464, 465
  See application file for complete search history.

(56) References Cited

U.S. PATENT DOCUMENTS

| 6,040,235 A | 3/2000 | Badchi | 438/464 |
| 6,235,612 B1 * | 5/2001 | Wang et al. | 438/460 |
| 6,236,111 B1 * | 5/2001 | Legay et al. | 257/730 |
| 6,326,689 B1 | 12/2001 | Thomas | 257/734 |
| 6,781,244 B1 | 8/2004 | Prabhu | 257/778 |

OTHER PUBLICATIONS

U.S. Appl. No. 10/145,295, filed May 13, 2002.

* cited by examiner

*Primary Examiner*—Kevin M. Picardat
(74) *Attorney, Agent, or Firm*—Beyer Weaver & Thomas LLP

(57) ABSTRACT

A semiconductor device of the invention includes an integrated circuit formed on a semiconductor substrate having first and second surfaces and edges. The first surface includes electrical contact pads electrically connected with the integrated circuit. The first surface of the semiconductor substrate includes a top protective layer that has a surface portion extending beyond the edges of the semiconductor substrate. The surface portion of the top protective layer includes electrical contact pads that are electrically connected with electrical contact pad extensions and with the integrated circuit. The second surface of the semiconductor substrate includes a multiplicity of backside electrical connectors that are in overlapping electrical contact with corresponding electrical contact pad extensions forming lap joint electrical connections between the backside electrical connectors and the corresponding electrical contact pad extensions. Methods for constructing such devices and connections are also disclosed.

11 Claims, 11 Drawing Sheets

ELECTRICAL DIE CONTACT STRUCTURE AND FABRICATION METHOD

RELATED APPLICATIONS

This application is a continuation-in-part of U.S. patent application Ser. No. 10/145,295, entitled "Electrical Die Contact Structure and Fabrication Method", by Prabhu et al., filed on May 13, 2002 which is hereby incorporated by reference in its entirety for all purposes. This application is also a divisional of U.S. patent application Ser. No. 10/310,724, entitled "Electrical Die Contact Structure and Fabrication Method", by Ashok Prabhu, filed on Dec. 4, 2002 now U.S. Pat. No. 6,781,244 which is hereby incorporated by reference in its entirety for all purposes.

TECHNICAL FIELD

The invention described herein relates generally to semiconductor chip manufacturing processes. In particular, the invention relates to improved electrical contact structures and the methods for their manufacture.

BACKGROUND

One step in the manufacture of integrated circuit devices is known as "packaging" and involves mechanical and environmental protection of a semiconductor chip which is at the heart of the integrated circuit as well as electrical interconnection between predetermined locations on the silicon chip and external electrical terminals.

Presently, a number of conventional technologies are employed for packaging semiconductors. Wire bonding, tape automatic bonding (TAB), and flip chip connection are among the packaging techniques used in the industry.

Wire bonding employs heat and ultrasonic energy to weld gold bonding wires between bond pads on the chip and contacts on the package.

Tape automatic bonding (TAB) employs a copper foil tape instead of bonding wire. The copper foil tape is configured for each specific die and package combination and includes a pattern of copper traces suited thereto. The individual leads may be connected individually or as a group to the various bond pads on the chip.

Flip chips are integrated circuit dies which have solder bumps formed on top of the bonding pads, thus allowing the die to be "flipped" circuit side down and directly soldered to a substrate. Wire bonds are not required and considerable savings in package footprint may be realized.

Additionally, a so-called "T-contact" connector packaging method is employed by some manufacturers. This "T-contact" method is described in some detail in U.S. Pat. No. 6,040,235 which is hereby incorporated by reference.

Each of the above-described technologies has certain limitations. Both wire bonding and TAB bonding are prone to bad bond formation and subject the die to relatively high temperatures and mechanical pressures. Additionally, wire bond and TAB technologies are problematic from a package size viewpoint, producing integrated circuit devices having a die-to-package area ratio ranging from about 10% to 60%.

The flip-chip technology actually refers to methods of interconnection rather than packaging methods. However, flip-chip interconnection suffers from a number of limitations. For example, variations in solder bump uniformity and thermal expansion mismatching present problems. These difficulties limit the use of available substrates to silicon materials or materials which have thermal expansion characteristics similar to those of silicon.

The "T-contact" method yields an interconnect structure that is extremely sensitive to process conditions and suffers from reliability problems associated with "T-contact" disassociation. These problems will be described in greater detail hereinbelow.

The difficulties of a known "T-contact" connection can be illustrated with respect to FIGS. 1(a)–1(d). FIG. 1(a) is a cross-section view depicting an edge portion of a semiconductor die 100 that has just been separated from a semiconductor wafer in a singulation process. A silicon substrate 101 having an integrated circuit formed on its surface has been sandwiched between two glass layers 102, 103. Also depicted are the backside solder balls 104 that are used to interconnect the die 100 to other electrical systems. These backside solder balls 104 are connected to front side electrical contact pads 105 by a specialized electrical connection called a "T-contact". In this view, one such interconnection is shown by the metal layer 107 which makes electrical contact with one of the backside solder balls 104.

FIG. 1(b) is a close-up view depicting the "T-contact" electrical connection shown in the circular view 106 of FIG. 1(a). The backside glass layer 103 affixed to the substrate 101 with a thin epoxy layer 113. On the other side (the front side) of the silicon substrate 101 is a metal bonding pad 111 that is interconnected to the electronic circuitry formed on the silicon substrate 101. Also, on top of the silicon substrate 101 is a first passivation layer 112 that is typically formed of $SiO_2$. Some manufacturers add a second passivation layer 114, formed of benzo-cyclo-butene (BCB), onto the first passivation layer 112. The metal bonding pad 111 is accessible through an opening in the passivation layers 112, 114. Into the opening in the passivation layers 112, 114 is deposited a metal plug 115. Such plugs are commonly formed of Al—Si—Cu compounds (e.g., 94.5% Al, 5.0% Si, and 0.5% Cu). A tab 116 is typically formed over a portion of the passivating layers 112, 114 as shown. The tab 116 portion includes an exposed facet 117 which has an exposed surface.

A top protective layer 102 is attached to the top surface of the substrate 101 using a thin layer of epoxy 118. A metal layer 107 formed on the side of the die 100 forms an electrical contact with the exposed facet 117 thereby forming a conducting pathway to a corresponding solder ball (not shown) on the bottom of the die 100. Commonly, the metal layer 107 is formed using a different material than the plug 115 and tab 116 materials. In one example, the metal layer 107 is constructed of a deposited layer of aluminum/copper (Al/Cu) material. Many other process steps are used to construct such structures. A full description of an example process for constructing such structures is included in the previously referenced U.S. Pat. No. 6,040,235.

Although suitable for some purposes, the aforementioned implementation has some serious drawbacks which will be described with respect to the simplified schematic illustrations of FIGS. 1(c) and 1(d). FIG. 1(c) schematically depicts a simplified cross-section view of an intact "T-contact". A metal layer 151 is shown in electrical contact with a tab 152 that is electrically connected to a bonding pad (e.g., as in FIG. 1(b)). The connection between the metal layer 151 and the tab 152 is called a "T-contact" 153. Under processing conditions, and also under some operating conditions the "T-contact" 153 can undergo significant stresses. Under some conditions, a separation can occur in the "T-contact" 153 causing electrical connection failure and consequently chip failure. This situation is schematically depicted in FIG.

1(d), which shows a simplified cross-section view of an disconnected "T-contact" 154. The interconnect metal layer 151' is shown with a break in electrical contact to the contact 152', thereby breaking the electrical connection to the bonding pad (not shown). The depicted "T-contacts" are very vulnerable to this kind of connection failure. Among the advantages of the disclosed invention is that it substantially reduces the aforementioned type of connection failure.

What is needed is a manufacturable robust electrical connection that does not suffer from "T-contact" failure. Also needed are methodologies for fabricating such structures. The principles of the present invention are directed toward an improved electrical connection and methodologies for its fabrication.

SUMMARY OF THE INVENTION

In accordance with the principles of the present invention, the invention includes, among other things, a robust electrical connection and methods for its fabrication.

In one embodiment a semiconductor device having a plurality of edge mounted electrical contacts is disclosed. The embodiment includes an integrated circuit formed on a semiconductor substrate with first and second surfaces and edges. The first surface includes electrical contact pads electrically connected with the integrated circuit. The first surface of the semiconductor substrate includes a top protective layer that has a surface portion extending beyond the edges of the semiconductor substrate. The surface portion of the top protective layer includes electrical contact pads that are electrically connected with electrical contact pad extensions and with the integrated circuit. The second surface of the semiconductor substrate includes a multiplicity of backside electrical connectors that are in overlapping electrical contact with corresponding electrical contact pad extensions forming lap joint electrical connections between the backside electrical connectors and the corresponding electrical contact pad extensions.

Another embodiment includes a method embodiment for forming an edge mounted electrical connection to a semiconductor die. Such embodiment involves providing a substrate having a plurality of semiconductor dies and associated electrical contact pads formed thereon. Lap joint electrical connections are formed to the associated electrical contact pads. Electrical connections to the lap joints are formed and the substrate is singulated into a plurality of individual dies.

Another embodiment discloses a method for producing electrical die contact structures for integrated circuit devices. The method involves providing a plurality of integrated circuits on a semiconductor wafer having a front side and a backside. Each of the integrated circuits are delineated from other integrated circuits on the wafer by a plurality of saw streets and each integrated circuit includes a multiplicity of electrical contact pads with contact pad extensions that extend into the saw streets. A protective layer is attached to a front side surface of the wafer. Material is removed from the backside of the wafer in the saw streets until a bottom surface of the contact pad extensions is exposed defining notches along edges of the integrated circuit devices. Backside electrical connections are formed such that a portion of the backside electrical connections overlaps the bottom surface of the contact pad extensions. Solderable electrical contacts that are electrically interconnected with the backside electrical connections are formed on the backside of the wafer. The wafer is separated into a plurality of individual integrated circuit devices.

These and other aspects of the invention will be disclosed in greater detail in the following detailed description.

BRIEF DESCRIPTION OF THE DRAWINGS

The following detailed description will be more readily understood in conjunction with the accompanying drawings, in which:

FIGS. 1(*c*) and 1(*d*) are simplified schematic cross section views of the edge of a conventional "T-contact" semiconductor die and a depiction of "T-contact"failure.

It is to be understood that in the drawings like reference numerals designate like structural elements. Also, it is specifically pointed out that the depictions in the drawings are not necessarily to scale.

DETAILED DESCRIPTION OF THE INVENTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

Figure 1A:
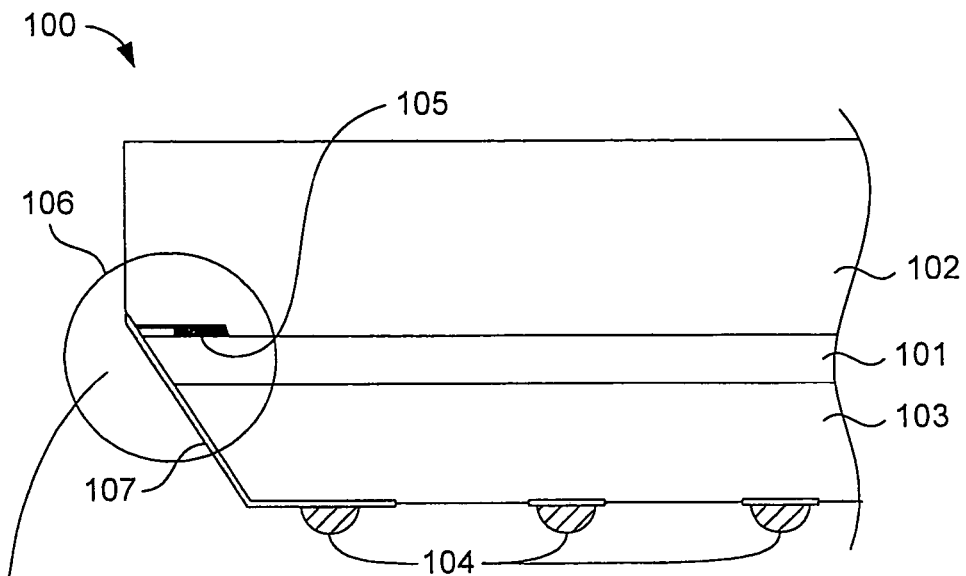
FIGS. 1(*a*) and 1(*b*) are simplified schematic cross section views of the edge of a conventional "T-contact" semiconductor die.
Figure 1B:
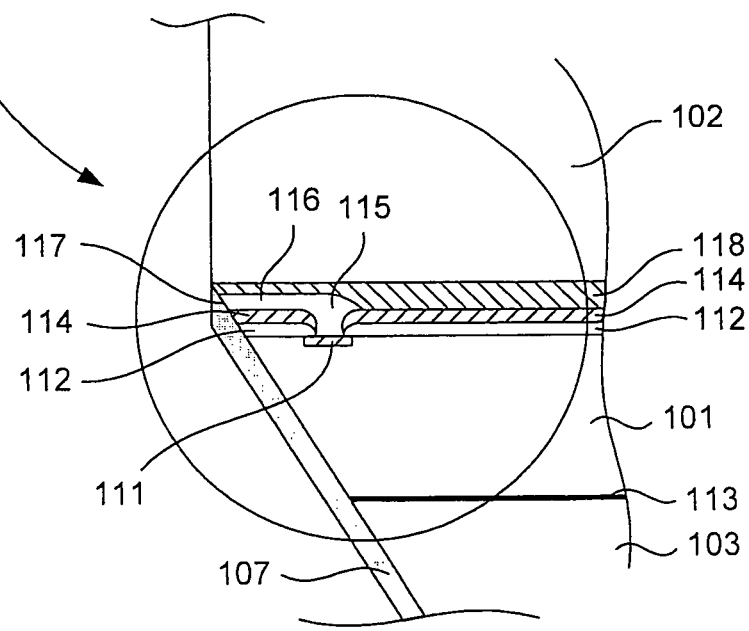
Figure 1C:
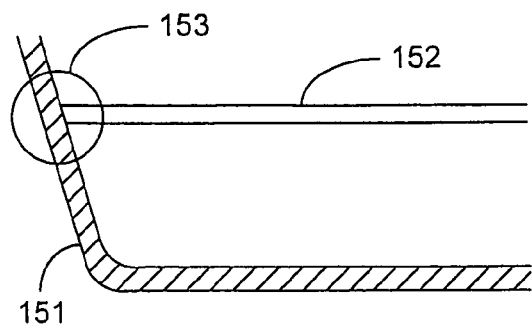
Figure 1D:
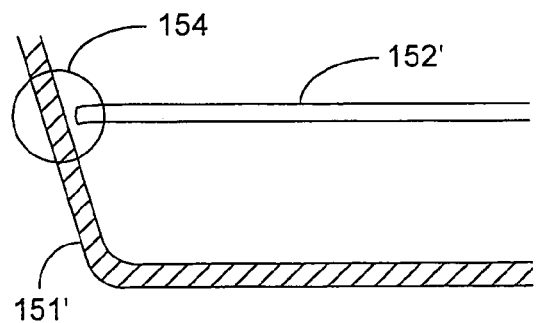
Figure 2:
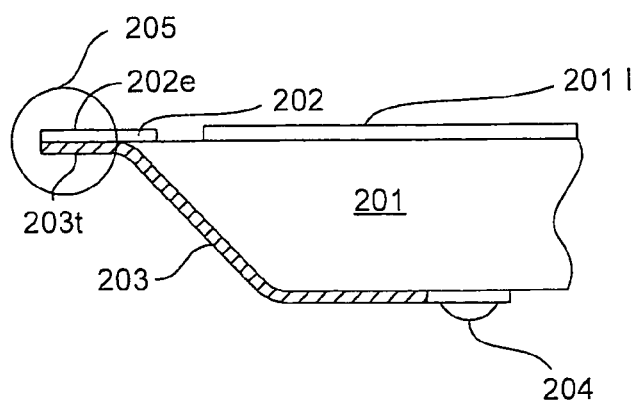
FIG. 2 is a simplified cross-sectional view of an improved electrical connector in accordance with the principles of the present invention.

One aspect of the invention includes the fabrication and implementation of a semiconductor die having a plurality of robust edge mounted electrical connectors (also referred to herein as lap joint electrical connectors or lap joints). FIG. 2 depicts a generalized implementation of the principles of the invention. A semiconductor substrate 201 has integrated circuit structures 201I formed thereon. The integrated circuit structures 201I are electrically connected to a contact pad 202. The contact pad 202 includes a contact pad extension 202*e* that extends beyond the edges of the substrate 201. Examples of such contact pads 202 and extensions 202*e* include without limitation, outer contact pad extensions that form an integral part of an extended length contact pad or separate outer contact pad extensions that are electrically connected to corresponding inner contact pads using electrically conducting bridges. Either of these extensions are referred to herein as contact pad extensions 202e. The contact pad extension 202e of the contact pad 202 provides a robust (and some implementations a substantially flat) contact surface for further electrical connections. Backside electrical connectors 203 are formed on the backside of the semiconductor substrate 201 and on an edge portion of the semiconductor substrate 201. Importantly, the backside electrical connectors 203 overlap portions of the contact pad extension 202e that extend beyond the edges of a semiconductor substrate 201 to form a lap joint electrical connection 205 (shown encompassed by the circle) that electrically interconnects the integrated circuit structure 201I to the backside electrical connector 203. Additionally, the backside electrical connector 203 is electrically connected to a corresponding electrical connector 204 on the backside surface of the semiconductor substrate 201.

With respect to FIG. 2, the lap joint is shown here in the circled region 205. The portion 203t of the backside electrical connector 203 that contacts the contact pad extension 202e of the top contact pad 202 is referred to as the tail 203t. The tail 203t forms an electrical connection with a corresponding contact pad extension 202e to form the lap joint. The tail 203t overlaps the corresponding contact pad extension 202e to form a robust lap joint electrical connection that is not subject to the same type of separation failures that plague prior art T-joints. In some embodiments, the tail 203t can be substantially co-planar with the contact pad extension 202e. Such lap joints 205 are robust and not as vulnerable to process condition variations as the "T-contact" or other electrical connections and packaging methodologies.

Figure 3:
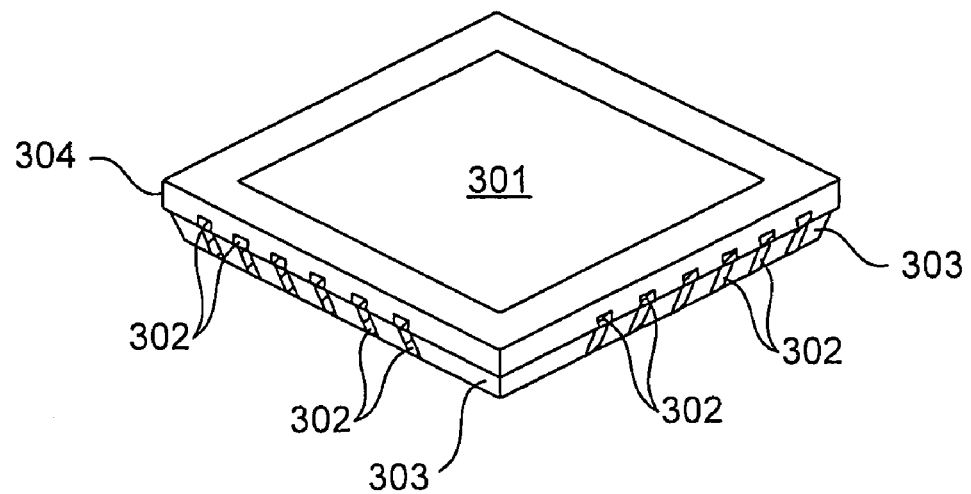
FIG. 3 is a perspective view of a semiconductor substrate embodiment constructed in accordance with the principles of the present invention.

FIG. 3 illustrates a preferred embodiment of a semiconductor die 300 having an integrated circuit device 301 formed thereon. In one embodiment, the integrated circuit device 301 comprises an image sensor constructed and operative in accordance the principles of the present invention. Any number of other types of integrated circuit devices can be formed on the semiconductor die. The depicted embodiment includes a relatively thin and compact, environmentally protected and mechanically strengthened integrated circuit package having a multiplicity of electrical contacts 302 formed along the edge surfaces 303 thereof. In accordance with a preferred embodiment of the invention, contacts 302 extend over edge surfaces 304 of the package.

Figure 4:
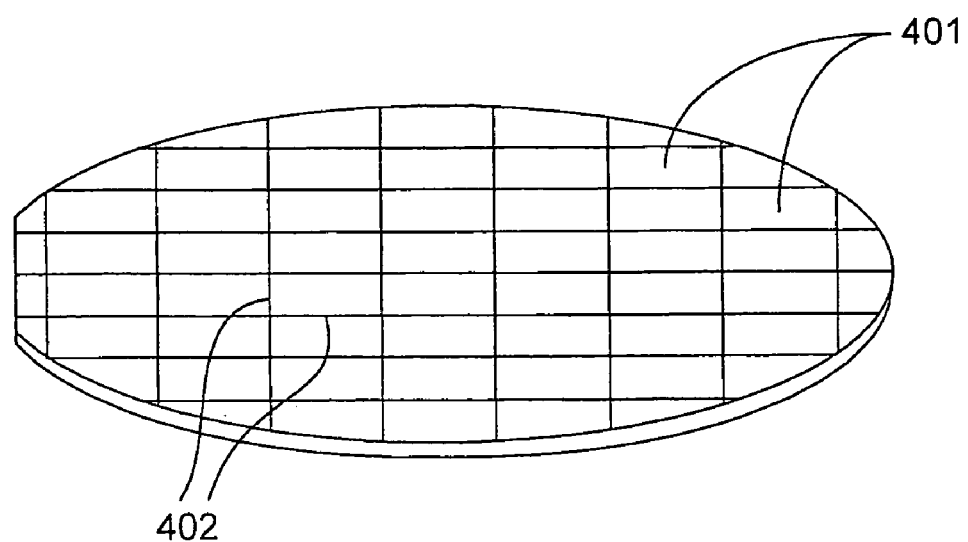
FIG. 4 is a perspective view of a semiconductor wafer in readiness for processing in accordance with the principles of the present invention.

FIG. 4 depicts a complete silicon wafer 400 having a plurality of finished dies 401 formed thereon by conventional techniques. This silicon wafer 400 forms a basic starting point for many of the process methodologies described hereinbelow. In a typical implementation, an eight-inch silicon wafer about 750 micron (μ) thick can be used. Other wafer materials can be used including, but not limited to gallium arsenide (GaAs), gallium indium arsenide (GaInAs), or other semiconductor materials. Additionally, wafers of different sizes can also be used. Also depicted, are "saw streets" 402 which are used to delineate the scribe lines used to separate ("singulate") the dies 401 into individual IC chips.

One process embodiment suitable for forming integrated circuit die embodiments in accordance with the principles of the invention is disclosed with respect to FIGS. 5A–5I.

Figure 5A:
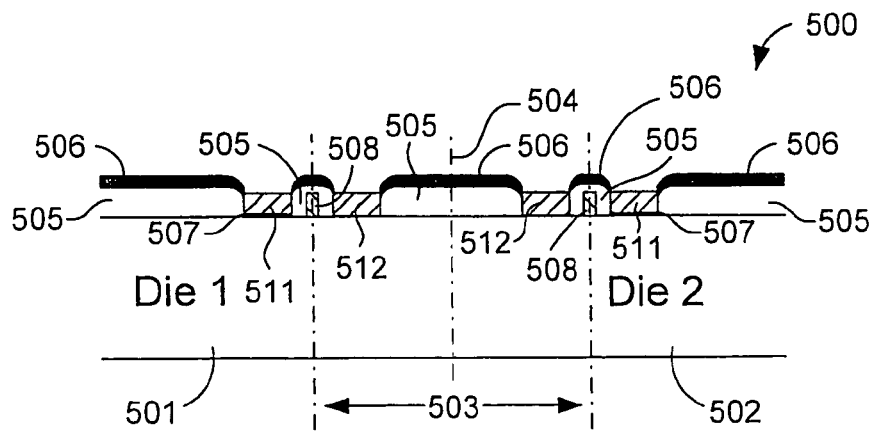
FIGS. 5A–5I are cross-section views of a portion of a semiconductor substrate showing a process embodiment used for fabricating a lap joint electrical connector in accordance with the principles of the present invention.

FIG. 5A is a cross-section view of a portion of a wafer 500. The depicted portion of the semiconductor substrate 510 shows the intersection of a first die 501 and a second die 502. The depicted wafer is about 750 μ thick. The boundaries of a saw street 503 are identified by the dashed/dotted lines. The center of a scribe line 504 is also depicted. The saw street 503 is a region where a saw blade singulates the wafer along the scribe line 504. In the depicted embodiment the saw street is on the order of about 250 μ wide. The wafer is shown having a first passivation layer 505. Many dielectric materials can be used to form the first passivation layer 505. Typical examples include, but are not limited to $SiO_2$, nitride materials, low-K dielectric materials, as well as many other suitable insulating materials. An optional second passivation layer 506 can also be formed on the first passivation layer 505. Such a second passivation layer 505 can be formed using an electrically insulating material, for example, BCB. In the depicted embodiment, each die has an inner contact pad 507 that is electrically connected to the integrated circuit of its respective die (not shown here). In the depicted embodiment, each die 501, 502 also has a metal guard ring 508.

Above each inner contact pad 507 is an inner opening in the passivation layers 505, 506. The depicted embodiment also illustrates an outer opening formed in the passivation layers 505, 506. This outer opening is formed on the other side of the guard ring 508 from the inner opening. Inner conducting plugs 511 are formed in the inner openings in the passivation layers. Also, outer conducting plugs are formed in the outer openings in the passivation layers to form contact pad extensions 512. This is distinct from conventional embodiments, which do not include both inner and outer conducting plugs. Conducting materials are used to form the inner conducting plugs 511 and contact pad extensions 512 (i.e., the outer conducting plugs). Such materials are commonly metals and metal alloys, for example, Al—Si—Cu compounds (e.g., 94.5% Al, 5.0% Si, and 0.5% Cu). Many other conducting materials or compounds can be used.

Figure 5B:
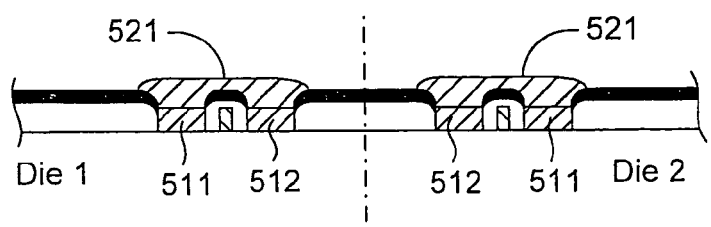

FIG. 5B depicts a next step in the process embodiment. FIG. 5B depicts only the uppermost portion of the wafer depicted in FIG. 5A. The inner conducting plugs 511 are electrically connected to the contact pad extensions 512 by a bridge layer 521. This is typically achieved by selectively depositing the bridge layer 521 of conducting material over the guard ring 508 onto an inner conducting plug 511 and its corresponding contact pad extension 512 thereby establishing a conducting path between them. This is a departure from conventional processes that do not use contact pad extensions, instead relying on "T-contacts". Such bridge layers 521 are formed of conducting materials (e.g., metals, alloys, and other conducting materials or compounds). In preferred embodiment the bridge layer 521 is comprised of the same materials as the inner conducting plug 511 and contact pad extension 512. In one embodiment a bridge layer 521 comprises an Al—Si—Cu compound (e.g., 94.5% Al, 5.0% Si, and 0.5% Cu). Many other conducting materials and compounds can be used.

Figure 5C:
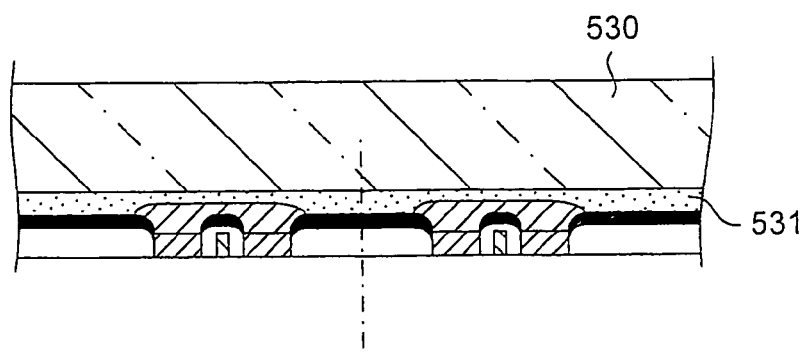

Referring to FIG. 5C, a next step in the embodiment comprises bonding the top surface of the wafer 500 to an insulating cover plate 530 (also referred to herein as a protective layer). Typically, the protective layer 530 is bonded using a layer 531 of adhesive such as epoxy. The protective layer 530 typically comprises glass, alumina, beryllia, sapphire or any other suitable insulative substrate. Such protective layers 530 can be of any thickness. In one preferred embodiment, the protective layer 530 is about 400 μ thick. The epoxy layer 531 should be relatively thin. In one embodiment the epoxy layer 531 is about 10μ. Typically, the protective layer 530 is attached by applying epoxy and the protective layer to the wafer. The wafer and protective layer are spun at an appropriate temperature and pressure.

In cases where the integrated circuit device formed in the wafer 500 is an optical device (e.g., optical imagers, lasers, optical transceivers, photo-sensors, arrays of photodiodes, charge coupled devices (CCD's), CMOS devices, and numerous other light sensitive optical detectors or other related optical devices) the epoxy 531 can be an optically transmissive epoxy. Also, the protective layer 530 can be optically transmissive. Where the optical properties of the protective layer 530 and epoxy 531 are not important to the function of the integrated circuit device, other protective layers 530 and epoxies 531 may be used. It should be noted that these optically transmissive layers can be used with other optically sensitive integrated circuit structures (e.g., EPROM's).

Figure 6A:
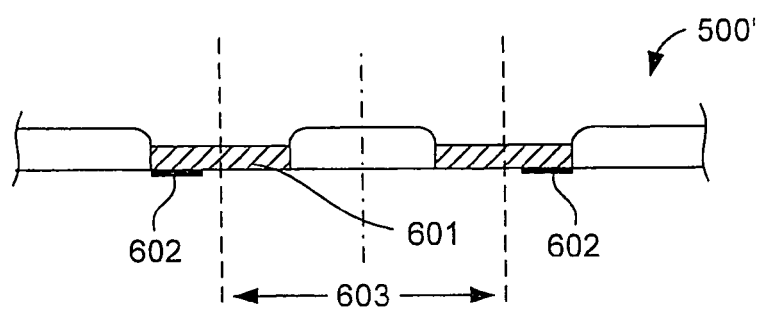
FIGS. 6A and 6B are cross-section views of a portion of a semiconductor substrate having an extended length electrical contact pad used in another process embodiment for fabricating a lap joint electrical connection in accordance with the principles of the present invention.
Figure 6B:
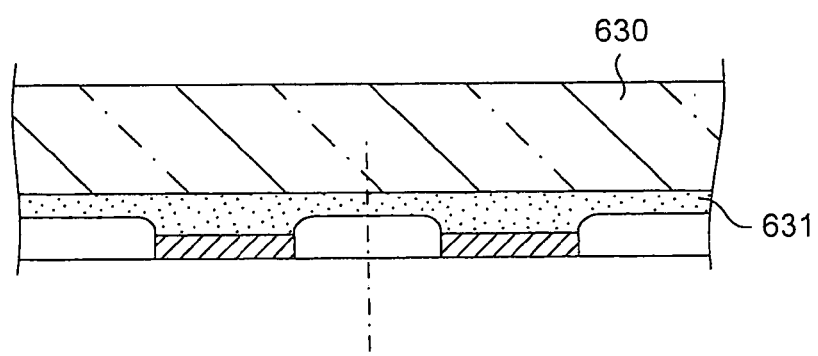

An alternative electrical contact structure is discussed with respect to FIGS. 6A and 6B. An extended length plug 601 is formed on the wafer 500' used in place of the previously discussed bridged inner and outer plugs. Instead of using the inner conducting plug 511 and an contact pad extensions 512 electrically connected by bridge layer 521 as discussed in, for example, FIG. 5B, a single extended length contact pad 601 is used. Each extended length contact pad 601 is in electrical contact with a contact pad 602 that is electrically connected (not shown here) to the integrated circuit of its respective die. This extended length plug 601 has a portion that extends into the saw street 603. This embodiment has the advantage of not requiring an additional step to form the bridge between two plugs. Such an embodiment is particularly suitable for use with wafers 500' that do not include guard rings.

FIG. 6B depicts an approach for attaching a protective layer to the substrate. Similar to the approach used in describing FIG. 5C, a protective layer is bonded to the top of the depicted wafer. In FIG. 6B, a protective layer 630 is bonded to the top surface of the wafer via a layer 631 of epoxy. As above, the protective layer 630 can comprise glass, alumina, beryllia, sapphire or any other suitable insulative substrate. Also, as above a protective layer 630 can be of any thickness, with a preferred thickness being about 400μ. In cases where the integrated circuit device formed in the wafer comprises an optical device the epoxy 631 and protective layer 630 can be an optically transmissive epoxy. Other protective layers 630 and epoxies 631 can also be used where desired.

Figure 5D:
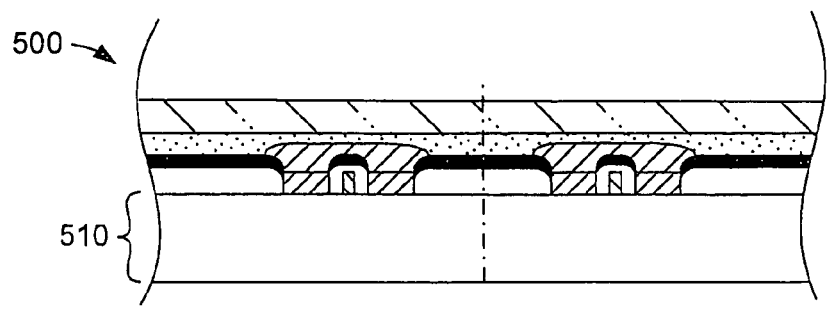

The process can continue from either FIGS. 5C or 6B. As such, for the sake of simplicity, the following explanation will be directed to the embodiment depicted FIGS. 5A–5C. As depicted in FIG. 5D, the wafer 500 can be thinned. Although such wafer thinning is not strictly necessary to practice the invention, it is advantageous to do so. FIG. 5D is a cross-section view of a portion of the wafer 500 depicted in FIGS. 5A–5C. Specifically depicted is a portion of the wafer referred to here as a semiconductor substrate 510. In one embodiment, the substrate 510 can be thinned in a two-step process. A bulk grinding process and a stress removal process. Bulk grinding can be achieved by a number of commonly used processes known to persons having ordinary skill in the art. For example, chemical mechanical polishing (CMP) or mechanical grinding may be used. In one embodiment, the backside of the substrate 510 can be thinned by using a grinding apparatus such as a Model 32BTGW using 12.5A abrasive, which is commercially available from Speedfam Machines Co., Ltd. of England. In typical embodiments, the substrate 510 is subject to back-grinding until it is about 75–110μ thick.

Because bulk back-grinding is known to induce mechanical stresses into the substrate, stress removal processes can be advantageously employed. In one embodiment, a precision removal of backside material is used to reduce stress.

For example, such precision removal of backside material can use etch techniques to remove the final 10–15μ of material from the backside of the semiconductor substrate 510. This continues until the semiconductor substrate 510 is about 65μ to about 80μ thick. In preferred embodiment, the final substrate thickness is about 75μ thick. Many processes known to persons having ordinary skill in the art can be used to accomplish this thinning and stress removal in the semiconductor substrate 510. In one embodiment, atmospheric downstream plasma (ADP) etching is used to remove stress by precision removal of backside material from the substrate. In one example process, a wafer having been subjected to bulk back-grinding is placed in a process chamber of an ADP etch system. For example, a TE-2001 series ADP machine available from Tru-Si Technologies of Sunnyvale, Calif. can be used. An argon flow of about 1 standard liter per minute (slm) is supplied along with a gas flow of suitable fluorine containing gases. Examples of suitable fluorine containing gases include $CF_4$, $SF_6$, as well as other fluorine containing gases. Suitable gas flow rates for the fluorine containing gases are about 4 slm to about 6 slm, but may vary with gas type chosen as well as other process needs. Such precision removal of backside material continues until the semiconductor substrate 510 obtains the final desired thickness.

Figure 5E:
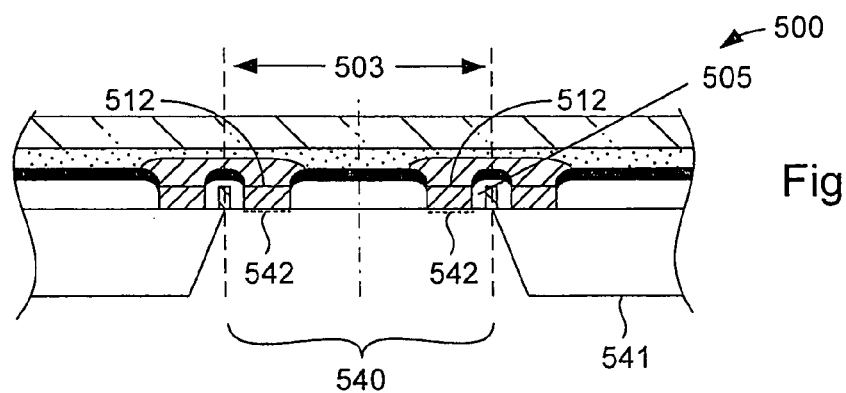

FIG. 5E is a cross-section view of a portion of the wafer 500 depicted in FIGS. 5A–5D. FIG. 5E depicts a first etching of the backside surface 701 of the wafer to form an opening 540 in the saw street 503. This first etching continues until the front side passivation layer 505 and a surface oxide layer 542 (mostly located beneath the outer conducting plugs 512) is reached. This can be achieved using a variety of the etch techniques known to person having ordinary skill in the art. In one example, a wet etch using a conventional silicon etching solution, such as a combination of 2.5% hydrofluoric acid, 50% nitric acid, 10% acetic acid and 37.5% water, so as to etch the silicon down to the surface oxide layer 542, as shown in FIG. 5E. The etching stops when oxide 542 and passivation layers 505 are reached.

Figure 5F:
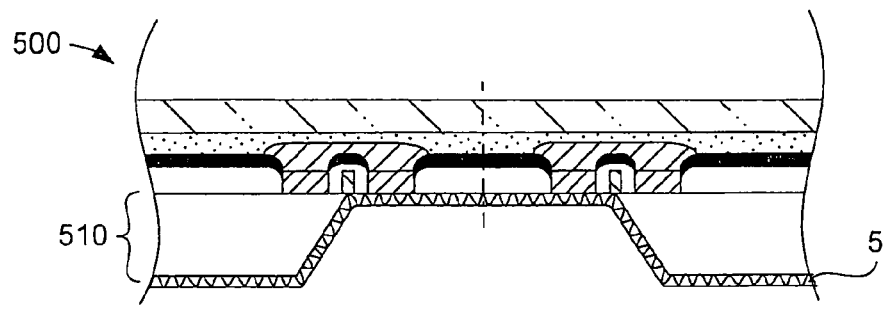

FIG. 5F is a cross-section view of the wafer 500 depicted in FIGS. 5A–5E with some added processing shown. Onto this wafer is deposited a layer 552 of photo-definable electrically insulating material. Such materials can have patterns formed therein using photolithographic processes, and are thus said to be photo-definable. In one embodiment, the layer 552 is formed of BCB about 10–15μ thick. Such a layer 552 can be formed using spin deposition or other deposition techniques known to persons having ordinary skill in the art.

Figure 5G:
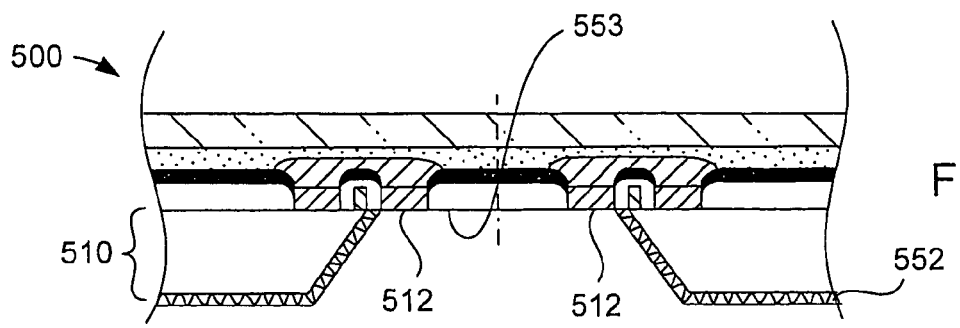

Referring to FIG. 5G, the layer 552 of photo-definable electrically insulating material is patterned using photolithographic techniques. The pattern is developed and the photo-definable material is removed from a bottom portion 553 of the saw street. Any remaining oxide material present on the bottom surface of the contact pad extensions 512 is also removed. Such etching continues until the bottom of the contact pad extensions 512 are exposed. At this point the exposed bottom surface of the contact pad extensions 512 can be cleaned of any remaining residues.

Figure 5H:
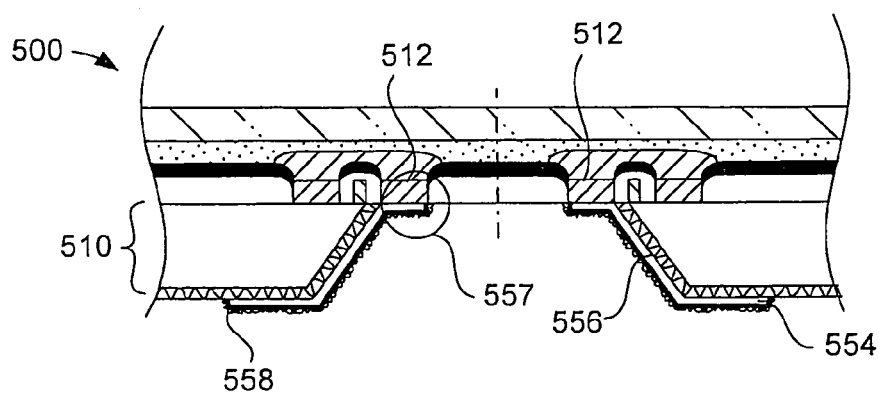

At this point, referring to FIG. 5H, backside electrical connectors can be formed. In some implementations, the backside electrical connectors are formed of a metal material. The metal material can be deposited as a backside metal layer 554 formed in accordance with a pattern that enables electrical connectors on the backside of the wafer to be connected with the integrated circuitry formed on the front side of the wafer. The backside metal layer 554 can be formed of any conducting material, but in preferred embodiments is formed of highly conductive metal metals or alloys. Typical examples include, but are not limited to aluminum, copper, and other conducting materials and alloys. In the depicted embodiment, the backside metal layer 554 is formed by sputter depositing aluminum over selected portions of the backside of the wafer. In particular, the metal layer 554 is formed on the bottom surface of the contact pad extensions 512 and the BCB-coated side walls 556 of the notch. Although not depicted here, the backside metal layer 554 can optionally cover the entire bottom surface of the notch. In other embodiments, such as the one depicted, the backside metal layer 554 only covers the contact pad extensions 512 and does not cover the entire bottom of the notch. In this way individual connections can be made between the contact pad extensions 512 and the backside metal layers 554. Importantly, the backside metal layer 554 overlaps the bottom surface contact pad extension 512 forming a lap joint electrical connection (depicted as the area inside the circle 557). The backside metal layer 554 makes an overlapping electrical contact with a corresponding contact pad extension 512. This "lap joint" is quite different from the transverse connection made in the prior art "T-contact". In preferred embodiment, the material of the contact pad extension 512 and backside metal layer 554 are such that the lap joint is formed of a single alloyed material. This forms a considerably stronger electrical connection than a conventional "T-contact"connection which uses two separate materials. This robustness is further enhanced by the overlapping nature of the contact at the lap joint 557. This forms an electrical contact that is substantially more robust than the aforementioned "T-contact".

With further reference to FIG. 5H, the structure is cleaned to present a good surface for further processing. Typically, such cleaning is used to remove, among other things, oxide build up on the backside metal layer 554. In one implementation plasma dry etching is used to clean the backside metal layer 554. Once cleaned, the surface of the backside metal layer 554 can be treated with a metal protective layer 558. Typically, this is electro-plated or deposited onto the backside metal layer 554. This metal protective layer 558 is typically formed of a "protective" conducting material such as nickel, platinum, or gold. In one embodiment, the metal protective layer 558 can actually comprise a metal bi-layer including one layer formed of nickel material about 2500–4000 nm thick and another layer formed of gold material about 70–200 nm thick.

Figure 5I:
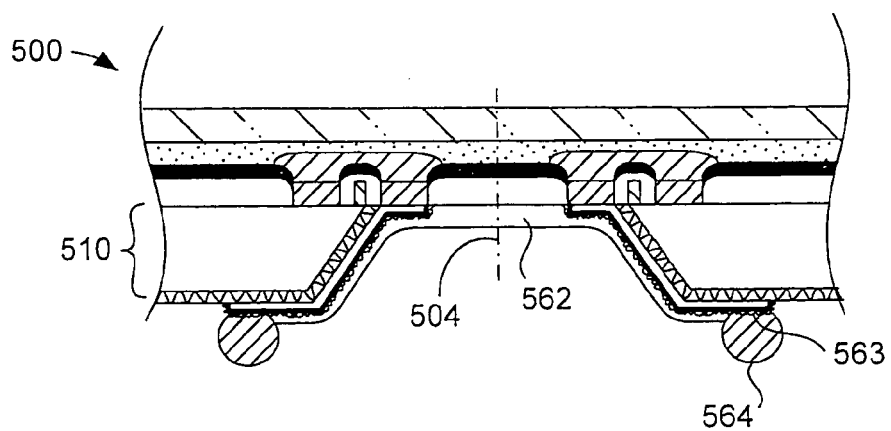

Referring to FIG. 5I, solderable electrical connections can be formed on the backside metal layer 554. In the depicted embodiment, a solder mask 562 is deposited and photo-lithographically patterned and developed to form a bonding pad 563 suitable for having a solder ball 564 formed thereon. The methodologies for forming such solder mask 562 layers, bonding pads 563 and solder balls 564 are well known to those having ordinary skill in the art. For example, the solder balls can formed using micro solder mask deposition techniques well known in the art. Typical solder ball materials include, but are not limited to eutectic solders (e.g., tin (Sn)/silver (Ag)/lead (Pb) solders and Sn/Pb solders). Also, the inventor also specifically contemplates the use of lead-free solders.

The dies can then be singulated by cutting apart the dies, for example, along the scribe lines 504 to separate the several dies of each wafer.

Another approach to forming suitable semiconductor die embodiments in accordance with the principles of the invention is disclosed with respect to FIGS. 7A–7K. Aspects of this implementation are described in detail in the U.S. patent application Ser. No. 10/145,295, entitled "Electrical Die Contact Structure and Fabrication Method", by Prabhu et al., filed on May 13, 2002 which is hereby incorporated by reference in its entirety for all purposes. The depicted embodiment begins with a substrate fabricated in accordance with the process described in FIGS. 5A–5E and/or FIGS. 6A–6B.

Figure 7A:
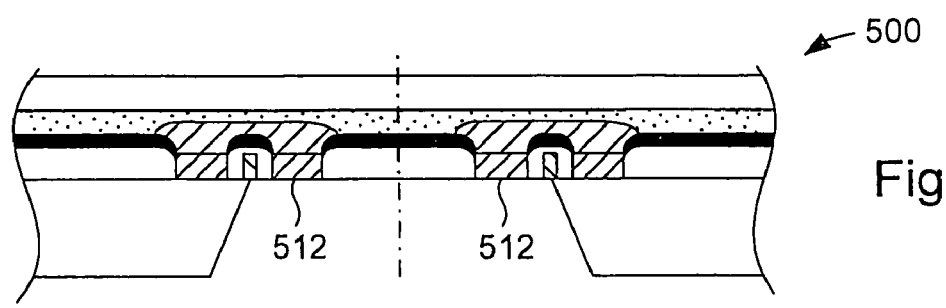
FIGS. 7A–7K are cross-section views of a portion of a semiconductor substrate showing another process embodiment used for fabricating a lap joint electrical connection in accordance with the principles of the present invention.

FIG. 7A is a cross-section view of the lower portion of the wafer 500 having been fabricated in accordance with the operations described with reference to FIGS. 5A–5E. FIG. 7A depicts the substrate after a second etching of the backside of the wafer has been performed to remove any remaining oxide layer to expose the bottom of the contact pad extensions 512. Typically, dry etch techniques are used. For example, using an Argon etch at about 8–10 kA. The second etching stops when front side oxide is removed and the metal of the contact pad extensions 512 is exposed.

Figure 7B:
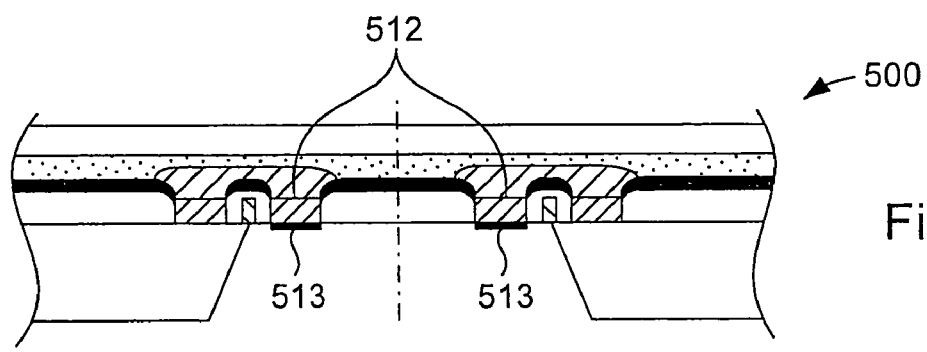

FIG. 7B depicts an optional contact pad thickening step. The bottom surface of the contact pad extensions 512 can be treated with a layer of conducting material 513 to form a thickened contact pad extension. In one implementation the conducting material can be deposited onto the bottom of the contact pad extensions 512. The conducting material can be metals, alloys, or other conducting compounds. Other methods including, but not limited to electroplated, sputter deposition, or other metal deposition techniques can be used to form the layer of conducting material 513. In preferred embodiments, the layer of conducting material 513 is formed of the same material as the contact pad extensions 512. In some embodiments, the layer of conducting material 513 can be formed of aluminum, Al—Si—Cu, or Al—Cu compounds.

Figure 7C:
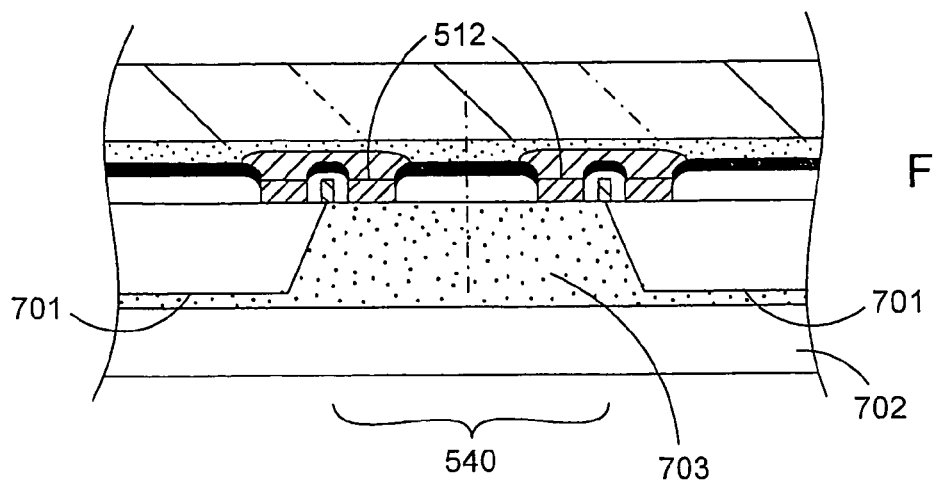

Referring to FIG. 7C, the next step in the embodiment comprises bonding the bottom surface 701 of the wafer to an insulating cover plate (also referred to herein as a bottom protective layer 702) via a second epoxy layer 703. As with the top protective layer, the bottom protective layer 702 typically comprises glass, alumina, beryllia, sapphire or other suitable insulating material. Such bottom protective layers 702 can be attached by applying the second epoxy layer 703 and the protective layer 702 to the wafer bottom. A bottom protective layer 702 can have many thicknesses but is preferably about 400μ thick. The second epoxy layer 703 coats the bottom side of the wafer 701 and fills the opening 540 and covers the contact pad extensions 512. The second epoxy layer 703 should be relatively thin. In one embodiment the second epoxy layer 703 can be about 10μ thick. The wafer and protective layer are adhered to each other by spinning together at an appropriate temperature and pressure.

Figure 7D:
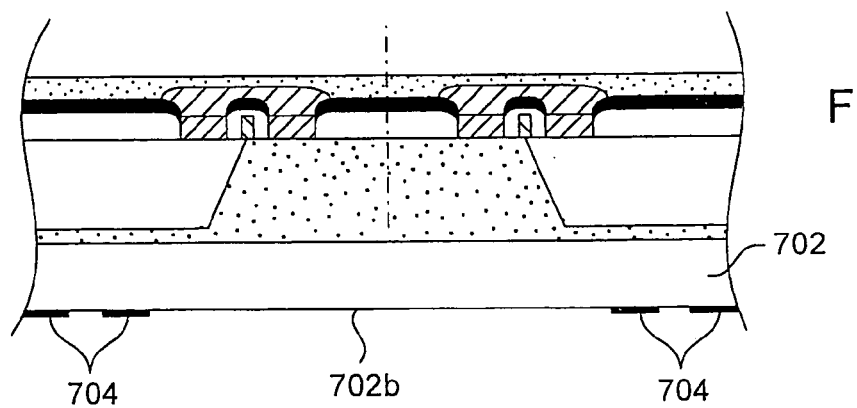

FIG. 7D depicts the lower portion of FIG. 7C and shows a next step of forming a plurality of backside pads 704. The backside pads 704 are patterned and formed on the bottom surface 702*b* of the bottom protective layer 702. It should be noted that this step can be implemented at many other stages in the process. The backside pads 704 are formed of a material having a low coefficient of thermal expansion. This is because metal contacts that are formed on the backside pads 704 are subjected to reflow processes (explained later) which can transfer heat to the bottom protective layer 702. Such heat transfer can result in damage to the backside pads 704. To avoid this problem, backside pads 704 are formed of materials having a low coefficient of thermal expansion (also, referred to as low modulus materials). These backside pads 704 can be patterned using any methodologies known to person having ordinary skill in the art. Typical examples include, but are not limited to selective deposition of low modulus material or deposition of the low modulus material coupled with selective etching to form the desired pattern of backside pads 704. Many low modulus materials can be used to form the pattern of backside pads 704. However, preferred implementations use commonly available photo-resist materials.

Figure 7E:
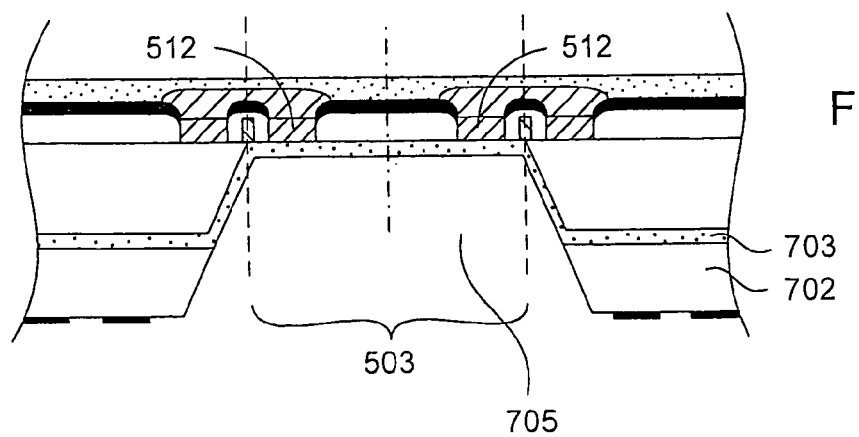

Referring to FIG. 7E, the next step in the embodiment comprises notching step wherein the bottom protective layer 702 and the second epoxy layer 703 are notched in the saw street 503. Typically such backside notching can be achieved by cutting a notch 705 in the saw street region 503. The cut passes completely through the bottom protective layer 702 and into the second epoxy layer 703. The notch 705 does not penetrate completely through the second epoxy layer 703. A thin layer of second epoxy about 10–20μ thick remains at the bottom of the notch 705. The metal of the contact pad extensions 512 is not exposed. Also, in embodiments where a layer of conducting material 513 (e.g., as shown in FIG. 7B) is formed on the contact pad extensions 512, the layer of conducting material 513 is not exposed.

For clarity, throughout the specification and claims, the terms "cutting" and "cut" shall have broader than usual meaning and shall refer to removal of material or separating along a line by any suitable technique, such as, for example, etching, sawing, sandblasting and milling. In one embodiment the notch 705 is made by cutting with a scribing apparatus such as a Kulicke & Soffa 775 dicing saw employing an Ni plated diamond loaded blade.

Figure 7F:
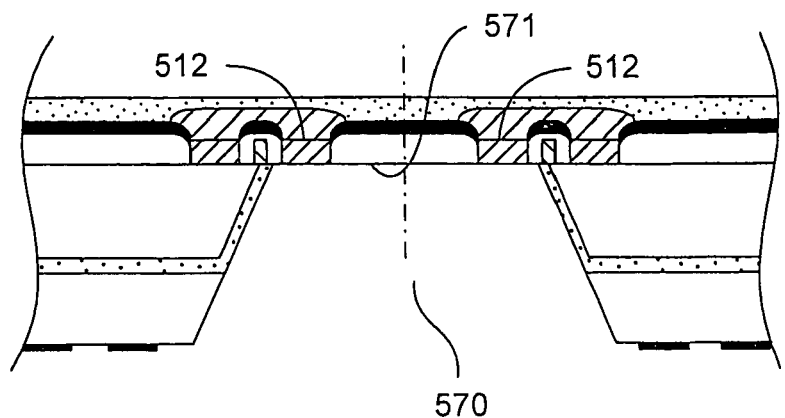

Referring to FIG. 7F, a second epoxy removing step is performed. In this step the thin layer of second epoxy is removed from the bottom 571 of the notch 705 exposing the contact pad extensions 512. This second epoxy removal can be achieved using any material removal techniques known to those having ordinary skill in the art. In one embodiment the thin layer of second epoxy is removed using plasma etching techniques, for example, using an oxygen plasma etch. Such etching continues until the bottom of the contact pad extensions 512 are exposed. At this point the exposed bottom surface of the contact pad extensions 512 can be cleaned of any remaining residues.

Figure 7G:
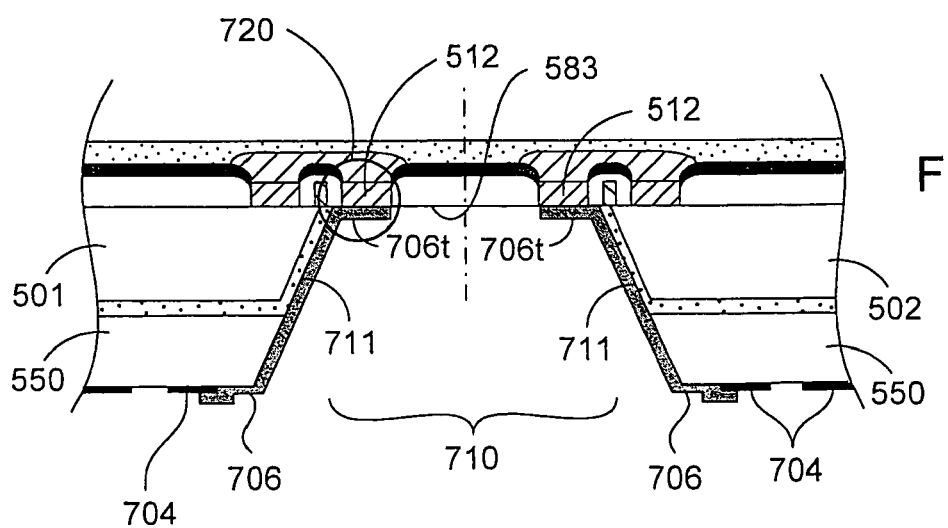

Referring to FIG. 7G, backside electrical connectors can be formed. Commonly such connectors are formed using metal layers. One such backside metal layer 706 is formed in accordance with a pattern that enables electrical connectors on the backside of the wafer to be connected with the integrated circuitry formed on the front side of the wafer. The backside metal layer 706 can be formed of any conducting material, but in preferred embodiments is formed of highly conductive metals or alloys. Typical examples include, but are not limited to aluminum, copper, and other conducting materials and alloys. In the depicted embodiment, the backside metal layer 706 is formed in the notch region 710. In particular, on the bottom surface of the contact pad extensions 512, the side walls 711 of the notch, and on the surface the bottom protective layer 702. In this way individual connections can be made between the contact pad extensions 512 and the backside pads 704. The backside metal layer 706 overlaps the bottom surface contact pad extension 512 forming a lap joint (shown in the circle 720). The backside metal layer 706 makes a overlapping contact with a surface of a corresponding contact pad extension 512. This is quite different from the transverse connection made in the prior art "T-contact". The portion 706*t* of the backside metal layer 706 making contact with the contact pad extension 512 is referred to as a tail 706*t*. The materials of the tail 706*t* and of the contact pad extension 512 are chosen such that they form a robust alloyed junction. Materials of preferred embodiments are chosen such that the lap joint 720 is formed of a single alloyed material. This forms a considerably stronger electrical connection than that known in the "T-contact" connection which uses two separate materials. This robustness is enhanced by overlapping nature of the joint 720 caused by the co-extensive portions of the tail 580*t* and the pad extension 512. The joint 720 is can also be enhanced a substantially flat contact surface between of the co-extensive portions of the tail 580*t* and the pad extension 512. This forms an electrical contact that is substantially more robust than the aforementioned "T-contact".

In the depicted embodiment, the backside metal layer 706 includes an opening 583 between the backside metal layer 706 of die 1 501 and backside metal layer 706 of die 2 502. Such a configuration can be achieved by selective deposition of the backside metal layer 706 in the desired locations. Alternatively, such a configuration can be achieved by deposition of the backside metal layer 706 over the entire backside surface and the selectively etching away the metal until the backside metal layer 706 remains in the desired locations. The advantages of such a configuration will be presently discussed below. In an alternative embodiment, the backside metal layer 706 is deposited along the entire bottom surface of the notch, including the opening 583. Such a structure has the advantage of being simpler to construct, but also does not supply a readily configured encapsulation of the junction between the tail 706*t* and the contact pad extension 512.

Returning to the discussion of FIG. 7G, the structure is cleaned to present a good surface for further processing. Typically, such cleaning is used to remove, among other things, oxide build up on the backside metal layer 706. In one implementation plasma dry etching is used to clean the backside metal layer 706. Once cleaned, the surface of the backside metal layer 706 can be treated with a second backside metal layer. Typically, this is electro-plated or deposited onto the backside metal layer 706. This second backside metal layer is typically formed of a "protective" conducting material such as nickel, platinum, or gold. In one embodiment, the backside metal layer 706 has a second backside metal layer formed of a nickel layer about 2500–4000 nm thick. A gold layer of about 70–200 nm thick can be formed on the nickel layer. Other materials can be used to form such layers.

Figure 7H:
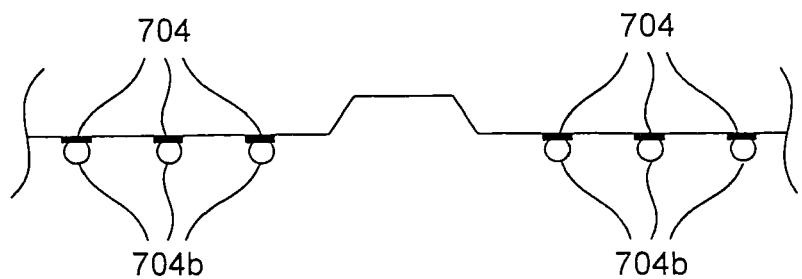

Referring to FIG. 7H, electrical connections can be formed on the backside pads 704. FIG. 7H depicts a cross-section view of a portion of the backside of a wafer. In the depicted embodiment, a solder material can be deposited on the backside pads 704. This solder material can be reflowed to form solder balls 704*b* on the backside pads 704. Typical solder materials include, but are not limited to eutectic solders (e.g., tin (Sn)/silver (Ag)/lead (Pb) solders and Sn/Pb solders). Also, the inventor also specifically contemplates the use of lead-free solders.

Figure 7I:
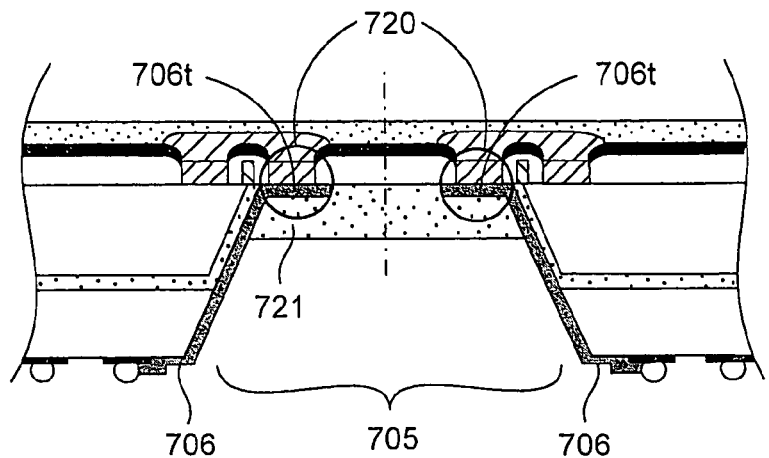

Referring to FIG. 7I, a sealing layer 721 is formed in the notch 705. The tails 706*t* of the backside metal layer 706 are fully encapsulated by the sealing layer 721. This sealing layer 721 encapsulates and protects the lap joint 720. Suitable sealing materials include epoxies, particularly those that form moisture resistant seals. For example, silica filled epoxy such as 4450 HF manufactured by Dexter, now available through Loctite Corporation can be used.

Figure 7J:
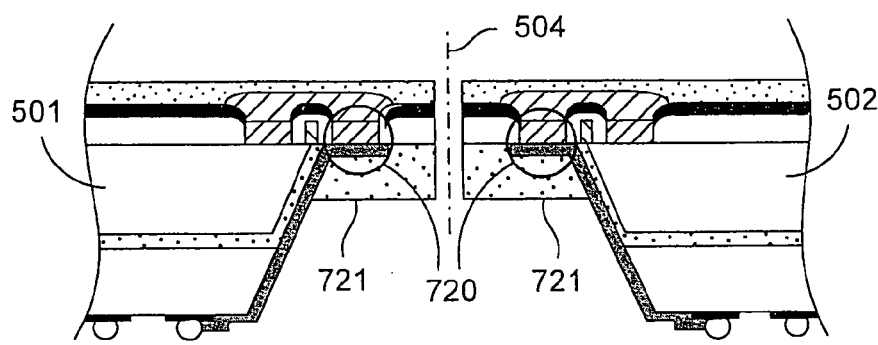

Referring to FIG. 7J, the dies are cut into individual IC chips (singulated). In the depicted example, die 1 501 is separated from die 2 502. In one embodiment, the singulation can be achieved by cutting along the scribe line 504 with a scribing apparatus. For example, a Kulicke & Soffa 775 dicing saw employing a Ni plated diamond loaded blade may be used. Thus each die can be singulated with epoxy sealing layers 721 that fully encapsulate and protect their associated lap joints 720.

Figure 7K:
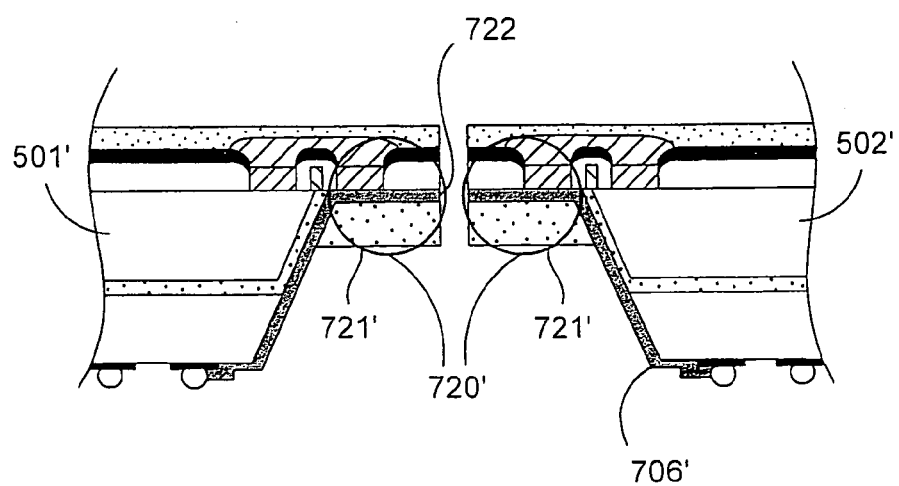

An alternative embodiment is depicted in FIG. 7K. Two dies 501' and 502' are in readiness for singulation. Referring back to FIG. 7G and the discussions pertaining thereto, when a backside metal layer 706' is formed contiguously across the bottom surface of the notch without an opening (unlike the opening 583 shown in FIG. 7G) the epoxy sealing layer 721' does not completely seal the lap joint 720' during the following processes (e.g., those explained with respect to FIGS. 7H and 7J). An exposed edge 722 of the lap joint 720' remains. This exposed edge 722 can either be sealed by further processing of left open at the discretion of the process engineer.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

The invention claimed is:

1. A method of forming an edge mounted electrical connection to a semiconductor die comprising:
   providing a substrate having a plurality of semiconductor dies and associated electrical contact pads formed thereon;
   forming lap joint electrical connection with the associated electrical contact pads;
   forming solder connections to the lap joint electrical connections; and
   singulating the substrate into a plurality of individual dies.

2. A method as in claim 1 wherein providing a substrate includes:
   providing a plurality of integrated circuits on a semiconductor wafer having a front side and a backside, each of the integrated circuits electrically connected to a multiplicity of front side mounted electrical contact pads that have contact pad extensions;
   wherein forming the lap joint electrical connections includes forming backside electrical connections on the backside of the wafer such that a portion of the backside electrical connection overlaps a portion of a corresponding contact pad extension establishing electrical contact between the backside electrical connection and the integrated circuits;
   wherein forming the solder connections to the lap joints comprises forming solder balls on the backside of the wafer; and
   wherein singulating comprises cutting the wafer into a plurality of individual dies.

3. A method for producing electrical die contact structures for integrated circuit devices, the method including the steps of:
   providing a plurality of integrated circuits on a semiconductor wafer having a front side and a backside, each of the integrated circuits being delineated from other integrated circuits on the wafer by a plurality of saw streets and each integrated circuit including a multiplicity of electrical contact pads with contact pad extensions that extend into the saw streets;
   attaching a front side protective layer to a front side surface of the wafer;
   removing material from the backside of the wafer in the saw streets until a bottom surface of the contact pad extensions is exposed, thereby defining notches along edges of the integrated circuit devices;
   forming lap joint electrical connections to the contact pad extensions;
   forming on the backside of the wafer solderable electrical contacts that are electrically interconnected with the lap joint electrical connections; and
   separating the plurality of integrated circuit devices into individual devices.

4. The method of claim 3 wherein forming lap joint electrical connections to the contact pad extensions includes forming backside electrical connections such that a portion of the backside electrical connections are arranged on the backside of the wafer and arranged such that a portion of the backside electrical connections overlaps the bottom surface of the contact pad extensions.

5. The method of claim 4, wherein the step of forming backside electrical connections on the backside of the semiconductor substrate includes:
   forming a layer of electrically insulating material on the backside of the wafer;
   removing a portion of the layer of electrically insulating material from the notch on the backside of the wafer to expose a bottom surface of the contact pad extensions; and
   forming layer of conducting material on the backside of the wafer such that a portion of the layer of conducting material overlaps the bottom surface of the contact pad extensions to form the backside electrical connection.

6. The method of claim 5, wherein forming the layer of conducting material on the backside of the wafer includes forming a protective layer of protective conducting material over the layer of conducting material.

7. The method of claim 5, wherein the step of forming solderable electrical contacts includes forming solder connections directly on the backside electrical connections.

8. The method of claim 6, wherein the step of forming solderable electrical contacts includes forming solder connections directly on the protective layer formed on the backside electrical connections.

9. The method of claim 3, wherein the providing step includes providing the semiconductor wafer wherein the electrical contact pads are separate from the contact pad extensions and are electrically interconnected using a bridge of conducting material.

10. The method of claim 3, wherein the providing step includes providing the semiconductor wafer wherein the integrated circuits comprise optical devices; and
    wherein attaching the front side protective layer comprises attaching an optically transmissive protective layer to a front side surface of the wafer using an optically transmissive adhesive material.

11. The method of claim 3, wherein the step of removing material from the backside of the wafer includes the step of thinning the wafer by removing material from the backside of the wafer.

* * * * *